United States Patent [19]
Howard

[11] 3,980,823
[45] Sept. 14, 1976

[54] KEYBOARD FOR BAR MATRIX CODE

[76] Inventor: Lawrence K. Howard, 14812 Addison St., Sherman Oaks, Calif. 91403

[22] Filed: June 9, 1975

[21] Appl. No.: 585,250

[52] U.S. Cl. .............................. 178/30; 178/17 C; 197/99
[51] Int. Cl.² ...................... H04L 21/02; B41J 7/54
[58] Field of Search......... 340/365 R, 365 S, 365 C, 340/365 L, 365 P, 365 A, 365 E, 336, 337; 178/30, 21, 17 R, 17 C; 197/4, 98, 99, 100; 235/145

[56] References Cited
UNITED STATES PATENTS

| | | | |
|---|---|---|---|
| 39,296 | 7/1863 | Livermore | 197/99 |
| 1,542,455 | 6/1925 | Howard | 197/98 |
| 3,588,875 | 6/1971 | Gabor | 197/98 X |
| 3,633,724 | 1/1972 | Samuel | 197/99 X |

Primary Examiner—Thomas A. Robinson
Attorney, Agent, or Firm—Harris, Kern, Wallen & Tinsley

[57] ABSTRACT

A keyboard for generating alpha-numeric character data for an output device such as a printer or display or transmission line or memory or the like. A keyboard with five sets of keys for operation with one hand to produce an eight bar matrix character code, with the sets positioned in a row and with the central sets selectively providing upper, lower and combination of upper and lower bars of the matrix.

8 Claims, 11 Drawing Figures

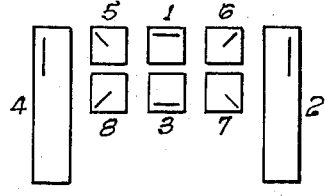
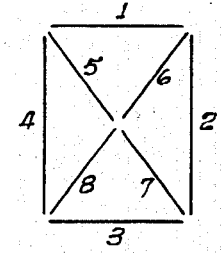
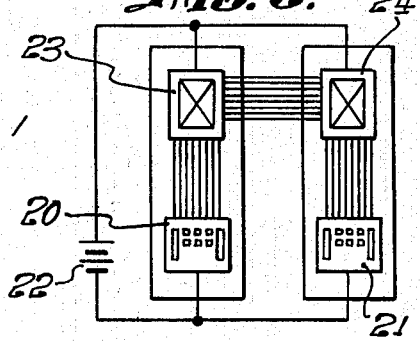
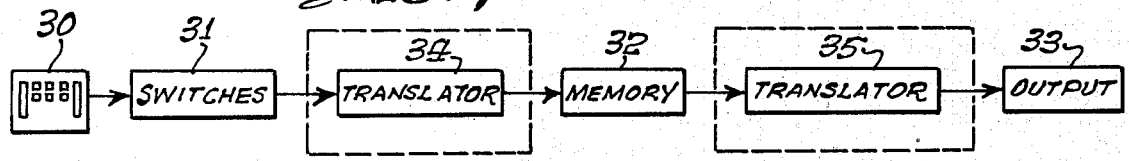
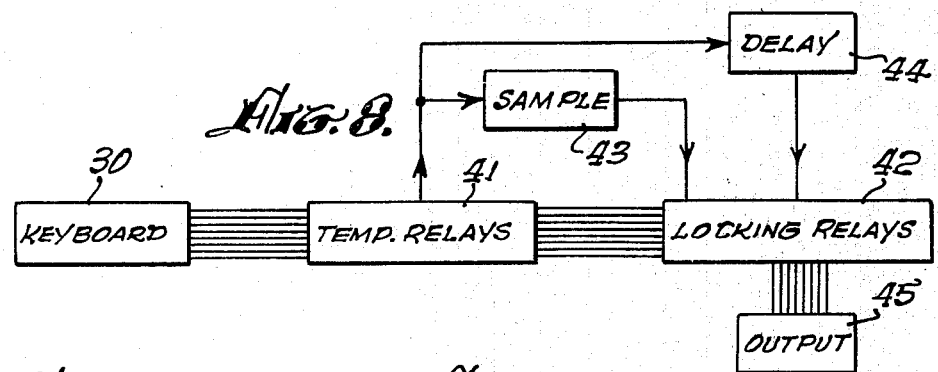
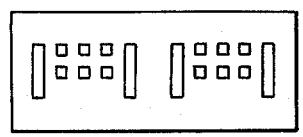
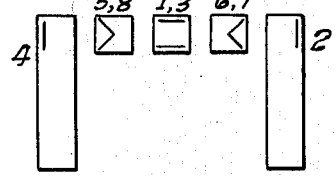
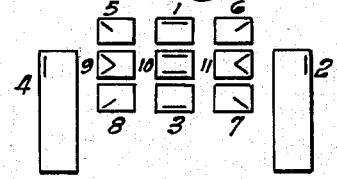

KEYBOARD FOR BAR MATRIX CODE

BACKGROUND OF THE INVENTION

This invention relates to keyboards for data generation, and in particular to a keyboard having a very small number of keys depressed singly or in combination to produce the desired alphabetic, numeric or special character.

The keyboard most commonly used at the present for this purpose is in the format of a numeric keyboard with control keys to shift to alphabetic characters. Other keyboards of this type are shown in U.S. Pat. Nos. 1,430,284 and 2,031,017. However, none of these have attained popularity because of the difficulty in learning the essentially random code necessary to their use. The present invention surmounts this problem by providing a bar matrix pattern and associated code which comprises an easily recognizable alphabet. The keys are arranged to correspond to the bar matrix pattern in such a way that a novice may begin to operate the device after a minimum of time and explanation.

The bar matrix pattern used may be that described in U.S. Pat. No. 3,704,343, which disclosed a contact plate with a stylus as the input means. Input speed and ease of operation of such a device have proven disappointing. The present invention overcomes these problems by providing a keyboard which may be operated without watching. One feature of the present invention resides in the arrangement of the keys, such that they correspond closely with the pattern of the bar matrix and that no more than two bars are controlled with one finger, thus providing a code that is easily learned by the novice and at the same time convenient to use.

It is an object of the present invention to provide an electronic keyboard all the characters of which may be produced easily with one hand, or with two hands operating sequentially. A further object is to provide a keyboard which has only a very few keys resulting in a small size, a short reach and therefore great speed in operation. An additional object is to provide a keyboard which has keys corresponding to a bar matrix pattern so that the associated code may be easily learned and which has symmetrical keying patterns so that either hand may operate the device without much additional training. Another object of the invention is to provide a keyboard which may be utilized with a variety of different output devices providing computer input or telecommunication via telephone lines or printout on paper or visual displays or the like.

SUMMARY OF THE INVENTION

The present invention contemplates an eight bar character format with four bars forming a rectangle and with four bars radiating from the center to the corners of the rectangle, with various combinations of the bars providing the various characters. In the preferred embodiment, the keyboard provides eight keys with contacts corresponding to the bars of the character format with the operator depressing the keys simultaneously or in sequence to generate a character. The keys are provided in five sets side-by-side for actuation by five fingers of one hand.

BRIEF DESCRIPTION OF THE DRAWING

FIG. 1 illustrates the presently preferred configuration of the keyboard of the invention;

FIG. 2 is a diagram of the eight bar character format for the keyboard of FIG. 1;

FIG. 3 illustrates English letters and numbers which may be produced with the keyboard of FIG. 1;

FIG. 4 illustrates alternative configurations of the letter 'E' which may be produced with the keyboard of FIG. 1;

FIG. 5 illustrates the phrase 'MATRIX-8 KEYBOARD.' produced with the keyboard of FIG. 1 and characters of FIG. 3;

FIG. 6 is a diagrammatic illustration of a communications system using the keyboard of FIG. 1;

FIG. 7 is a diagrammatic illustration of a communications terminal using the keyboard of FIG. 1;

FIG. 8 is a diagrammatic illustration of a keyboard output system;

FIG. 9 illustrates two of the keyboards of FIG. 1 positioned side-by-side for operation by two hands; and FIGS. 10 and 11 illustrate alternative configurations of the keyboard of FIG. 1.

DESCRIPTION OF THE PREFERRED EMBODIMENTS

The keyboard of FIG. 1 includes eight keys 1–8 which may be conventional in design. The keys are arranged in five side-by-side sets, with key 4 forming the first set, keys 5 and 8 the second set, keys 1 and 3 the third set, keys 6 and 7 the fourth set, and key 2 the fifth set.

The eight bar character format is shown in FIG. 2, with the bars of the character indentified by the corresponding key number 1–8. An alphabet and set of numbers 1-0 which may be formed with the keyboard is shown in FIG. 3.

The bar matrix code illustrated in FIG. 3 is not necessarily intended as a final output format, although it may be used as such. The purpose of the code is to provide keying patterns for the operator which are easily visualized and memorized. Most of the patterns shown are made to look like capital letters, with the exception of 'h' which does not adapt, and 'r' and 'q' which are more easily keyed in small letters. To further simplify memorization, alternative configurations of the letters, such as those shown in FIG. 4 for the letter 'E', may be interpreted as the same letter. In other applications, alternative configurations may be interpreted as foreign characters, so that the letters shown in FIG. 4 may represent various accented E's in French. An alternative alphabet code is shown in FIG. 4 of the aforementioned U.S. Pat. No. 3,704,343.

When operating the keyboard in FIG. 1 with the right hand, the thumb operates key 4, the index finger is placed between and operates keys 5 and 8, the middle finger operates keys 1 and 3, the ring finger operates keys 6 and 7, and the little finger operates key 2.

To produce the phrase 'MATRIX-8 KEYBOARD.', as illustrated in FIG. 5 using the keyboard in FIG. 1: depress key 6 with the ring finger and release to produce quote; depress key 4 with the thumb, depress key 5 with the index finger, depress key 6 with the ring finger, depress key 2 with the little finger, then release to produce 'M'; depress key 4 with the thumb, depress key 5 with the index finger, depress key 1 with the middle finger, depress key 6 with the ring finger, depress key 2 with the little finger, then release to produce 'A'; depress key 1 with the middle finger, depress key 2 with the little finger, then release to produce 'T'; depress key 4 with the thumb, depress key 1 with the middle finger, then release to produce 'R'; depress key 4 with the thumb, then release to produce 'I'; place the index finger between keys 5 and 8 and depress both simultaneously, place the ring finger between keys 6 and 7 and depress both simultaneously, then release to produce 'X'; depress key 1 with the middle finger, then release to produce dash; place the index finger between keys 5 and 8 and depress both simultaneously, place the middle finger between keys 1 and 3 and depress both simultaneously, place the ring finger between keys 6 and 7 and depress both simultaneously, then release to produce '8'; depress key 3 with the middle finger to produce space; depress key 4 with the thumb, depress key 8 with the index finger, place the ring finger between keys 6 and 7 and depress both simultaneously, then release to produce 'K'; place the index finger between keys 5 and 8 and depress both simultaneously, place the middle finger between keys 1 and 3 and depress both simultaneously, then release to produce 'E'; place the index finger between keys 5 and 8 and depress both simultaneously, depress key 6 with the ring finger, then release to produce 'Y'; depress key 4 with the thumb, place the middle finger between keys 1 and 3 and depress both simultaneously, place the ring finger between keys 6 and 7 and depress both simultaneously, then release to produce 'B';, depress key 4 with the thumb, place the middle finger between keys 1 and 3 and depress both simultaneously, depress key 2 with the little finger, then release to produce 'O'; depress key 4 with the thumb, depress key 5 with the index finger, depress key 1 with the middle finger, depress key 6 with the ring finger, depress key 2 with the little finger, then release to produce 'A'; depress key 4 with the thumb, depress key 1 with the middle finger, then release to produce 'R'; depress key 4 with the thumb, place the index finger between keys 5 and 8 and depress both simultaneously, then release to produce 'D'; depress key 7 with the ring finger, then release to produce '.'; depress key 6 with the ring finger, then release to produce quote.

All of the keys necessary to produce a character may be depressed simultaneously or in any sequence as long as not all keys are released before the character is complete. Two of the keyboards of FIG. 1 may be positioned side-by-side as shown in FIG. 9 permitting use of both hands.

In the alternative keyboard configuration shown in FIG. 10, only five keys are utilized. In this case, for example, key (5,8) is pushed away to activate bar 5, pulled toward the operator to activate bar 8, or pushed straight down to activate both. A key for performing these functions is illustrated in U.S. Pat. No. 3,633,724.

In the alternative keyboard configuration shown in FIG. 11, extra keys 9, 10 and 11 are provided for the second, third and fourth sets so that the depression of two keys with the same finger is no longer necessary. For example, to activate bars 5 and 8, key 9 is depressed.

In the embodiment illustrated in FIG. 6, two keyboards 20, 21 are connected via a power source 22 to light displays 23 and 24. Each display has eight light segments corresponding to the eight bar format of FIG. 2. The keyboards and displays are interconnected such that when a key is depressed on either keyboard, the corresponding light segment is illuminated on each display. The keyboard 20 and display 23 may be located at some distance from the keyboard 21 and display 24 so that a silent intercommunications system is provided for areas where talking is not allowed, or for an educational toy.

In the embodiment illustrated in FIG. 7, a keyboard 30 is connected to a set of switches 31. When a key is depressed, the corresponding switch is turned on. When all keys are released, the bits of information stored in the switches are transmitted to an electronic memory device 32. When a particular special character is interpreted on the switches, the contents of the memory 32 are transmitted to an output device 33. Such a device may be used as a computer or general communications terminal. For convenience in the design of the circuitry, additional keys may be provided for certain control functions, such as erase or transmit. In a variation of this embodiment, the data may be translated by an appropriate translating device 34 or 35 to a standard communications code, either as it is entered into the memory or at transmission time from the memory. Translation at the terminal is optional since it may be done at the receiving device in the case of a computer, or not at all in the case of a communications terminal. Conventional data communications components may be used.

FIG. 8 illustrates a keyboard output system suitable for use as the switches 31 of FIG. 7. The keyboard 30 is connected via temporary relays 41 to locking relays 42. The temporary relays 41 are normally closed and are connected in series to a sampling unit 43 and a delay unit 44. When a key at 30 is depressed, one of the temporary relays is opened, disengaging the sampling and delay units, and one of the locking relays is closed. If another key is depressed, the original key may be released and the sample is still not triggered as long as any of the temporary relays is open. Bits are thus stored at the locking relays 42 until all keys are released. Then current is allowed to flow to the sampling unit 43 and the resistor/capacitor delay unit 44. The sample is taken and the information is sent in parallel to an output device 45, which may be a memory, printer, translator, etc. When the delay time is exhausted, current is sent to the locking relays to release them. The sampling current needs to be less than the release current.

In constructing the keyboard, it is helpful to select keys with a fairly long key stroke. A key stroke of .1 inches and a pretravel of 0.06 inches is presently preferred. It is also helpful to provide a slightly embossed ridge on the adjacent edge of any key that is to be operated by the same finger as another key on the keyboard. Keys which may be depressed easily are desirable.

While exemplary embodiments of the invention have been disclosed and discussed, it will be understood that other applications of the invention are possible and that the embodiments disclosed may be subjected to various changes, modifications and substitutions without necessarily departing from the spirit of the invention.

I claim:

1. In a keyboard for producing bar matrix coded alpha-numeric data, with the bar matrix comprising four outer bars in a rectangular pattern and four inner bars radiating from the center of the rectangle to the corners of the rectangle, the combination of five sets of keys in side by side relation for actuation by the respective five fingers of an operator's hand, the first set comprising a key corresponding to the left vertical bar of said matrix, the second set comprising at least one key positioned to the right of said first set and corresponding to the two left inner bars of said matrix, the third set comprising at least one key positioned to the right of said second set and corresponding to the upper and lower horizontal bars of said matrix, the fourth set comprising at least one key positioned to the right of said third set and corresponding to the two right inner bars of said matrix, and the fifth set comprising a key positioned to the right of said fourth set and corresponding to the right vertical bar of said matrix.

2. A keyboard as defined in claim 1 wherein each of said second, third and fourth sets comprises a pair of keys positioned one above the other with each key corresponding to a separate bar of said matrix and with the keys of a pair adjacent each other for simultaneous and individual operation by a single finger.

3. A keyboard as defined in claim 1 wherein each of said second, third and fourth sets comprises a single key, with each of said single keys having three operative positions comprising an away position corresponding to the upper of the bars, a down position corresponding to both bars, and a toward position corresponding to the lower of the bars.

4. A keyboard as defined in claim 1 wherein each of said second, third and fourth sets comprises three keys positioned one above the other with the upper key corresponding to the upper of the bars, the central key corresponding to both bars, and the lower key corresponding to the lower of the bars.

5. A keyboard as defined in claim 1 and a second keyboard having said five sets of keys and positioned to one side of said one keyboard.

6. A keyboard as defined in claim 1 including:
switches closed by said keys when actuated;
means for connecting said switches to a storage unit for storing switch closure data; and
means for transmitting said switch closure data from said storage unit when the actuated keys are released.

7. A keyboard as defined in claim 6 including a translator unit for converting the character code of said keyboard to a different character code.

8. A keyboard as defined in claim 1 including:
an illuminated display having eight bars corresponding to the bars of said matrix; and
means for energizing a bar of said display when the key of the corresponding bar of said matrix is actuated.

* * * * *